(12) United States Patent
Wallace et al.

(10) Patent No.: US 7,521,157 B2
(45) Date of Patent: Apr. 21, 2009

(54) CROSS-SHAPED SUB-RESOLUTION ASSIST FEATURE

(75) Inventors: Charles H. Wallace, Portland, OR (US); Swaminathan Sivakumar, Portland, OR (US); Shannon E. Daviess, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 548 days.

(21) Appl. No.: 11/351,084

(22) Filed: Feb. 9, 2006

(65) Prior Publication Data

US 2007/0184355 A1 Aug. 9, 2007

(51) Int. Cl.
*G03F 1/00* (2006.01)
(52) U.S. Cl. .......................................... 430/5
(58) Field of Classification Search ................ 430/5, 430/311, 394
See application file for complete search history.

(56) References Cited

U.S. PATENT DOCUMENTS 6,777,276 B2 * 8/2004 Crowder et al. ............. 438/166

2006/0240331 A1 * 10/2006 O'Brien et al. ................ 430/5

OTHER PUBLICATIONS

U.S. Appl. No. 11/390,779, filed Mar. 27, 2006, entitled "Diagonal Corner-to-Corner Sub-Resolution Assist Features for Photolithography".
U.S. Appl. No. 11/296,983, filed Dec. 7, 2005, entitled "Sub-Resolution Assist Features for Photolithography With Trim Ends".
U.S. Appl. No. 11/297,209, filed Dec. 7, 2005, entitled "Non-Collinear End-to-End Structures with Sub-Resolution Assist Features".

* cited by examiner

*Primary Examiner*—Stephen Rosasco
(74) *Attorney, Agent, or Firm*—Trop, Pruner & Hu, P.C.

(57) ABSTRACT

Cross-shaped sub-resolution assist features may be utilized to print lithographic patterns in semiconductor fabrication processes. The crosses may be isolated structures or may be part of a grid arrangement. The main features, such as contacts, may be positioned on the mask so as to be intersected by the cross-shaped sub-resolution assist features. In some embodiments, the cross-shaped sub-resolution assist features may intersect the main feature at its center point in both the x and y directions.

19 Claims, 3 Drawing Sheets

CROSS-SHAPED SUB-RESOLUTION ASSIST FEATURE

BACKGROUND

This invention relates generally to semiconductor photolithograph and, in particular, to applying sub-resolution assist features.

Various systems may be used to print features, such as patterns, that define integrated circuits on semiconductor wafers. In general, electromagnetic wave emissions from a source are directed to expose selected locations on a substrate, while leaving other locations unexposed. Examples of emissions include visible light, ultraviolet (UV), and extreme ultraviolet (EUV) radiation, and x-rays. These emissions all have characteristic wavelengths in various media.

Example approaches to directing these emissions towards selected locations include selective attenuation (e.g., using binary photomasks), interference (e.g., using phase shifting masks), reflection (e.g., using EUV reflective optical elements), and beam steering. Regardless of the approach used, systems for printing features have a resolution limit below which certain features are not resolved during printing. In particular, it is desirable to manufacture features that are smaller than the lithographic wavelength. However, attempting to form features at these sizes, while achieving adequate resolution, may be complex. As mask features get closer together, a number of issues may arise, including diffraction issues.

DETAILED DESCRIPTION

Figure 1:
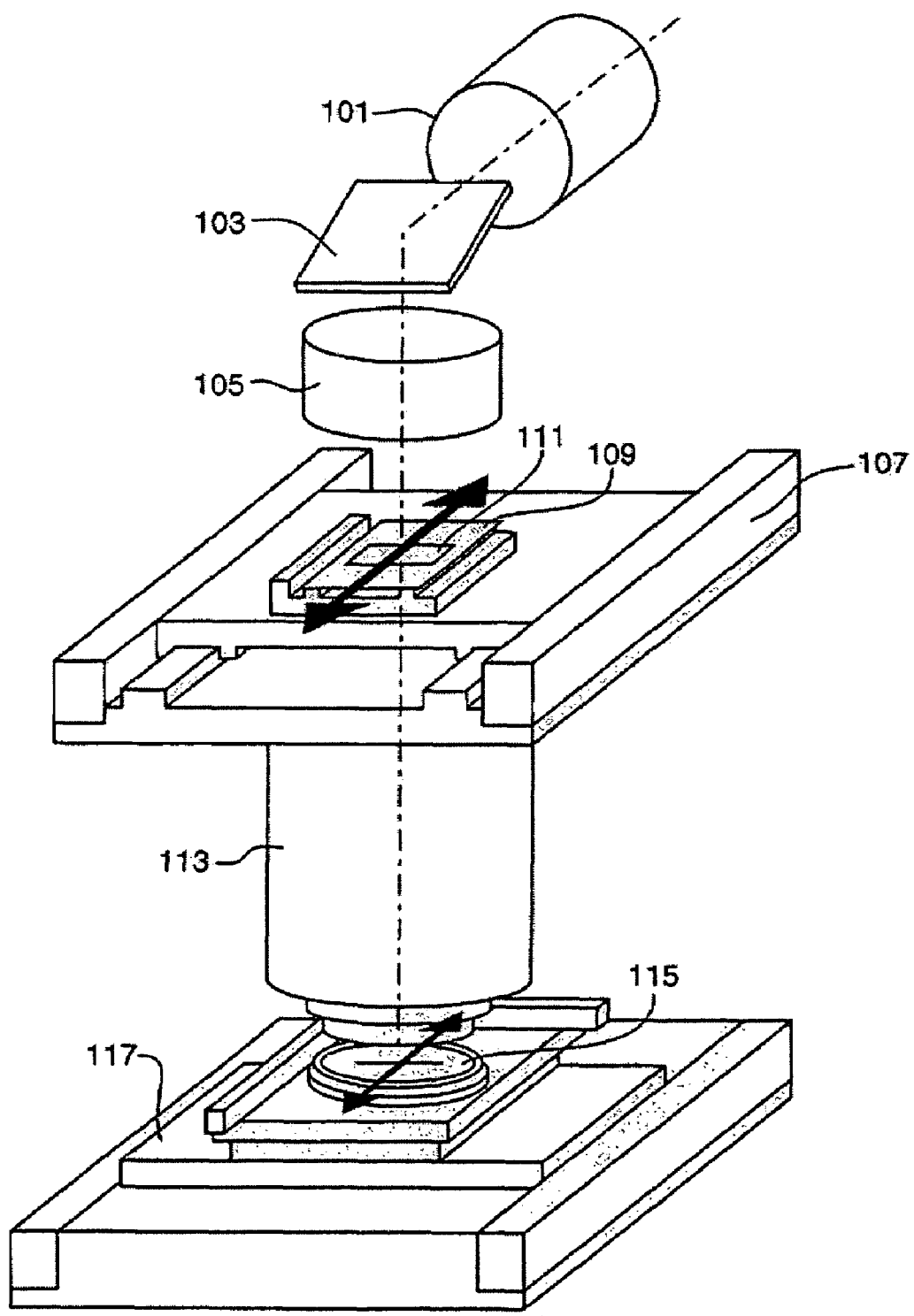
FIG. 1 is a schematic depiction of a semiconductor fabrication device suitable for application to embodiments of the present invention.

A patterning system 100, shown in FIG. 1, includes an illumination source 101, an illumination system 105, a mask 109, an imaging system 113, and a substrate 115.

Illumination source 101 may generate electromagnetic radiation. The radiation may be adapted for use in lithographic patterning of microelectronic devices to expose photosensitive materials. The radiation can be fully or partially coherent in that the admitted optical waves maintain a fixed and predictable phase relationship with each other for a period of time. The radiation may have a characteristic wavelength in various portions of the system 100, including in the vicinity of the substrate 125.

Illumination system 105 can include an aperture, a condenser, as well as additional devices for collecting, shaping, collimating, directing, filtering, and focusing radiation emitted from the source 101.

The mask 109 is positioned in the system 100 by a mask stage 107 to influence the incidence of radiation upon substrate 115. The mask 109 can include different regions that transmit electromagnetic radiation with different transmissivities and/or phases. The transmission of electromagnetic radiation by a mask 109 can be engineered to image a pattern of desired features on the substrate 115. For example, the mask 109 may be a binary mask or the mask 109 may be a phase shifting mask, such as an alternating phase shifting mask or an imbedded phase shifting mask. The mask 109 can transmit radiation (as shown) or a mask 109 can reflect radiation.

The imaging system 113 can include an aperture, an objective, as well as additional devices for collecting, filtering, and focusing the portion of radiation that passes through the mask 109 onto the substrate 115. For example, the imaging system 113 can include a filtering projection lens and/or reduction optics.

The substrate 115 is a work piece to be patterned by the system 100. The substrate 115 may include a working surface that includes a photosensitive material. The substrate 115 can be presented to the system 100 by a vacuum chuck 117 or other support such that radiation is focused in the vicinity of the working surface to image desired features in photosensitive material.

Given the optical characteristics and wavelength of radiation defining the resolution limit of the system 100, the dimension and arrangement of features that can be imaged in the photosensitive material is limited. For example, certain features may have too small a pitch to be imaged using radiation and, thus, may fall below the resolution limit of the system 100. As another example, adjacent features may be so closely spaced that radiation diffracts and/or constructively or destructively interferes to make the printing of such features more difficult.

Figure 2:
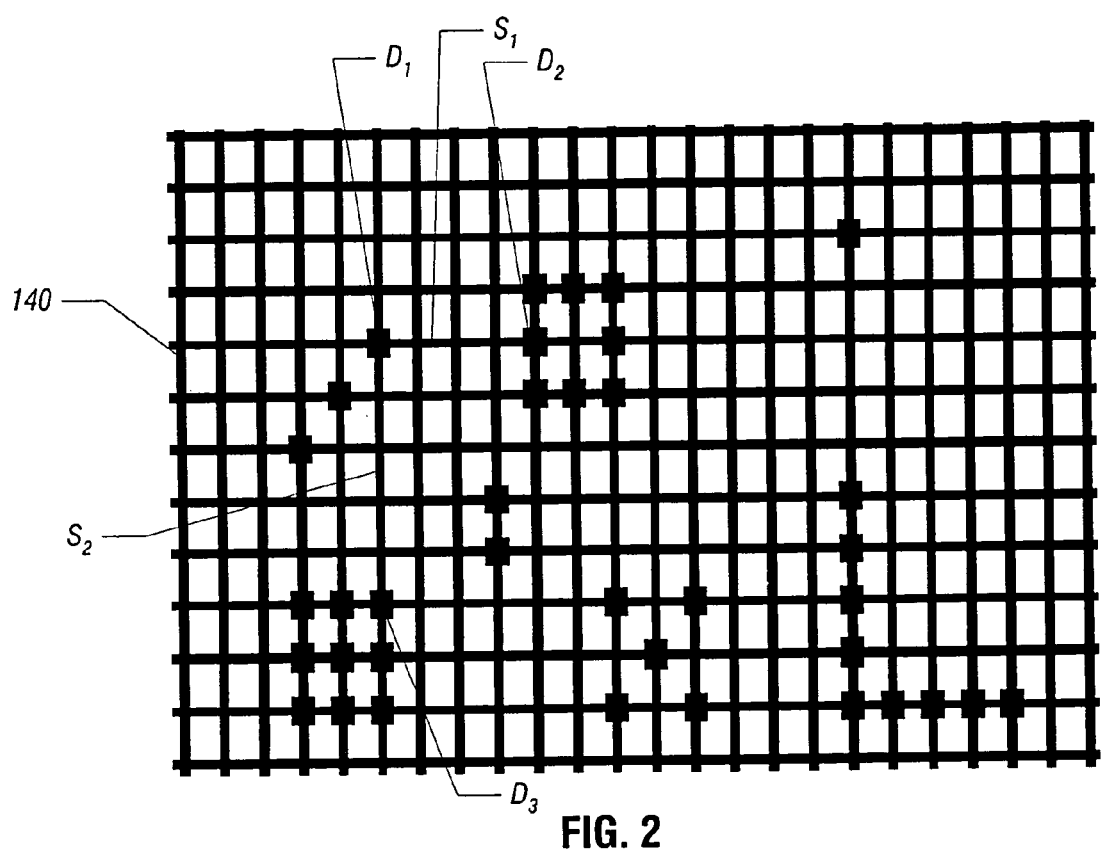
FIG. 2 is a depiction of a portion of a mask showing main features and sub-resolution assist features in accordance with one embodiment of the present invention.

Referring to FIG. 2, a mask, in accordance with one embodiment, may include main features D (e.g., D1, D2, D3, etc.), which may be contacts in one embodiment, and a cross-shaped sub-resolution assist feature 140 in the form of a grid pattern. The sub-resolution assist feature 140 is an element in a mask layout that enhances the printing of main features using the mask.

As used herein, "cross-shaped" simply means having at least two crossed segments. Those segments may be straight or curved. They may intersect perpendicularly or non-perpendicularly. The segments may have the same or different thicknesses. The term "cross-shaped" is not intended to refer to the religious symbol.

Of course, the main features D can be anything in other embodiments, including long rectangles and line/space patterns. The mask may be glass or chrome on the mask, resulting in a hole or island of photoresist.

Sub-resolution assist features are generally dimensioned below the resolution limit of the system 100 used to print the mask. Sub-resolution assist features can be adapted to a variety of masks and a variety of patterning systems. For example, sub-resolution assist features can direct electromagnetic radiation with different transmissivities and/or phases. Sub-resolution assist features can transmit or reflect the electromagnetic radiation used to print or the sub-resolution assist features can block or fail to reflect the electromagnetic radiation used to print (depending, e.g., on whether positive or negative photoresist materials are used). Thus, depending on the nature of the mask, the sub-resolution assist feature 140 can transmit/reflect/block/failure to do the same with different transmissivities and/or phases, as appropriate.

In the embodiment shown in FIG. 2, the contacts or main features D are joined physically by the intervening portions of the cross-shaped sub-resolution assist feature 140. Thus, adjacent main features D1 and D2 may be physically joined by an intervening sub-resolution assist feature 140 horizontal segment S1. Similarly, main features D1 and D3 are joined by vertical sub-resolution assist feature 140 and vertical segment S2. In this example, the segments S1 and S2 are perpendicular to one another.

In some embodiments, the use of the sub-resolution assist feature that connects main features contacts may improve the aerial image contrast. The sub-resolution assist feature connects to the desired main features, such as the contacts D, so sub-resolution assist feature connects to the desired feature in both dimensions and is placed in open areas surrounding the desired feature. As a result, a regular diffraction pattern at a constant pitch is created.

The placement of sub-resolution assist features in both the x and y directions through the center of the desired feature, connecting to the main feature to adjacent features, may improve resolution in some embodiments. A patterning process window enhancement may be accomplished, in some embodiments, by optimizing the optical illumination conditions to the pitch of the sub-resolution assist feature.

Figure 3:
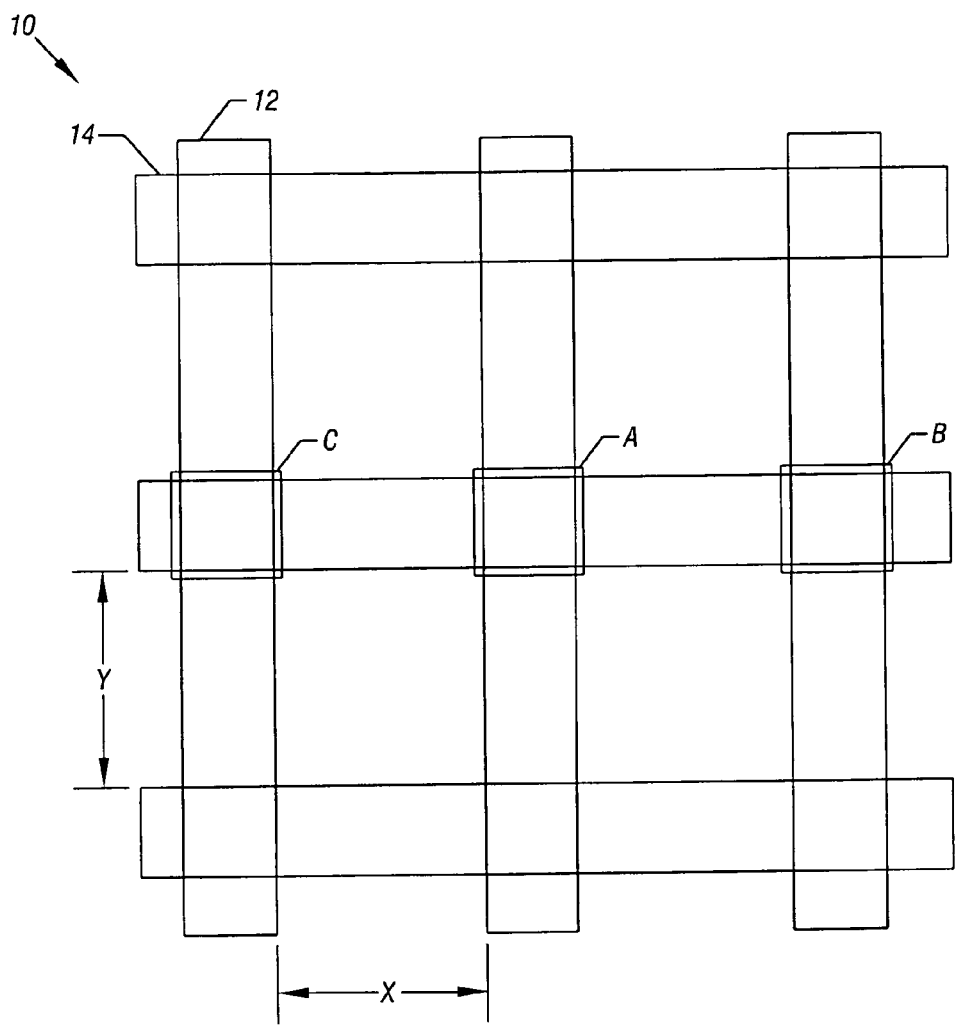
FIG. 3 is a diagram of a portion of a mask showing main features and sub-resolution assist features in accordance with another embodiment of the present invention.

Referring to FIG. 3, in accordance with still another embodiment of the present invention, the main features, such as contacts A, B, and C, are joined by sub-resolution assist strips 12 in the vertical direction and sub-resolution assist strips 14 in the horizontal direction. Note that the spacing between the vertical strips 12, indicated as x in FIG. 3, may be less than the vertical spacing, indicated by y, in FIG. 3.

Figure 4:
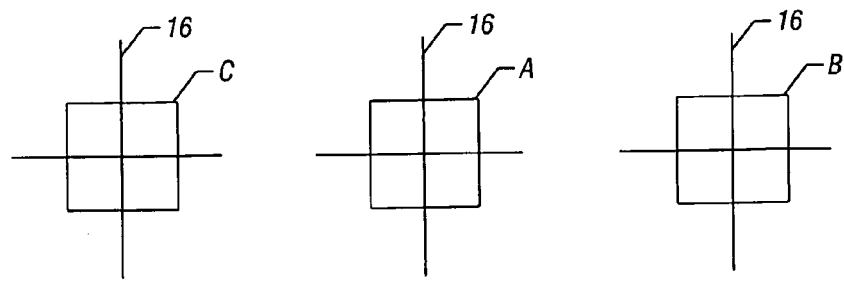
FIG. 4 is a diagram of a portion of a mask showing main features and sub-resolution assist features in accordance with still another embodiment of the present invention.

Referring to FIG. 4, each sub-resolution assist feature 16 has an isolated cross-shape uncoupled to other sub-resolution or assist features 16. Thus, each of the sub-resolution assist features 16 may be represented by a plus or cross-shape which is centered on each main feature A, B, or C. As a result, the sub-resolution assist feature 16 extends from the center of the main feature A, B, or C and extends in the form of an upward vertical straight segment 12 and a horizontal straight segment 14 which intersect centrally on the feature A, B, or C.

The use of sub-resolution assist features in a cross-shape may enhance the patterning of isolated, semi-dense, and dense arrays of main features, such as contacts, by providing a regular array of sub-resolution assist features.

In some embodiments, no differential sizing need be applied to any of the main features in the array based on their proximity. Thus, the cross-shaped sub-resolution assist features are able to create a pseudo nested environment, allowing for process optimization at one pitch only, rather than trying to balance nested, semi-dense, and isolated process windows, in some embodiments.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   using a cross-shaped sub-resolution assist feature to print a semiconductor pattern; and
   causing the sub-resolution assist feature to intersect a main feature to be printed.

2. The method of claim 1 including using a plurality of uncoupled cross-shaped sub-resolution assist features to print a semiconductor pattern.

3. The method of claim 1 including using a cross-shaped sub-resolution assist feature arranged in a grid work of connected horizontal and vertical segments.

4. The method of claim 1 including forming the sub-resolution assist feature of a size below the resolution limit of a printing process.

5. The method of claim 1 including causing the cross-shaped sub-resolution feature to extend horizontally and vertically and to intersect centrally on a main feature to be printed.

6. The method of claim 1 including forming a mask with a plurality of main features and a sub-resolution assist feature.

7. The method of claim 6 including connecting adjacent main features using said sub-resolution assist feature.

8. A lithographic mask comprising:
   a plurality of main features; and
   a cross-shaped sub-resolution assist feature joining at least two of said main features.

9. The mask of claim 8 wherein said main features are contacts.

10. The mask of claim 8 wherein said sub-resolution assist feature is a grid work.

11. The mask of claim 8 wherein said mask includes at least two cross-shaped sub-resolution assist features unconnected to one another.

12. The mask of claim 8 including an array of horizontal sub-resolution assist features intersecting an array of vertical sub-resolution assist features.

13. A lithographic mask comprising:
   a first linear sub-resolution assist feature; and
   a second linear sub-resolution assist feature intersecting and perpendicularly to said first linear sub-resolution assist feature.

14. The mask of claim 13 including a plurality of main features coupled by said first and second linear sub-resolution assist features.

15. The mask of claim 13 wherein said first and second linear sub-resolution assist features intersect at a main feature.

16. The mask of claim 15 wherein said main feature is a mask to form a contact.

17. The mask of claim 13 wherein said sub-resolution assist features intersect at the center of a main feature.

18. The mask of claim 13 wherein said sub-resolution assist feature is a grid work.

19. The mask of claim 13 wherein said mask includes at least two cross-shaped sub-resolution assist features unconnected to one another.

* * * * *